United States Patent
Lee et al.

(10) Patent No.: US 9,256,244 B2
(45) Date of Patent: Feb. 9, 2016

(54) USB3.0 CLOCK FREQUENCY GENERATION DEVICE WITHOUT CRYSTAL OSCILLATOR

(71) Applicant: ALGOLTEK, INC., Taoyuan, Taoyuan County (TW)

(72) Inventors: Tzuen-Hwan Lee, Taoyuan (TW); Chia-Chun Lin, Taoyuan (TW); Sheng-Chieh Chan, Taoyuan (TW)

(73) Assignee: Algotek, Inc., Taoyuan (TW)

( * ) Notice: Subject to any disclaimer, the term of this patent is extended or adjusted under 35 U.S.C. 154(b) by 287 days.

(21) Appl. No.: 13/927,858

(22) Filed: Jun. 26, 2013

(65) Prior Publication Data

US 2014/0082401 A1    Mar. 20, 2014

Related U.S. Application Data

(60) Provisional application No. 61/702,509, filed on Sep. 18, 2012.

(51) Int. Cl.
  *G06F 1/08* (2006.01)
  *H03L 7/099* (2006.01)
  *H03L 7/16* (2006.01)

(52) U.S. Cl.
  CPC .............. *G06F 1/08* (2013.01); *H03L 7/0992* (2013.01); *H03L 7/16* (2013.01)

(58) Field of Classification Search
  CPC .............. G06F 1/00; G06F 1/04; G06F 1/12; G06F 1/26; G06F 1/32; G06F 11/30; G06F 15/16
  See application file for complete search history.

(56) References Cited

U.S. PATENT DOCUMENTS

| | | | |
|---|---|---|---|
| 2004/0158759 A1* | 8/2004 | Chang | G06F 1/06 713/500 |
| 2011/0138215 A1* | 6/2011 | Kojima | 713/500 |
| 2012/0051479 A1* | 3/2012 | Liu et al. | 375/371 |
| 2013/0103969 A1* | 4/2013 | Wang et al. | 713/502 |
| 2015/0082073 A1* | 3/2015 | Yang | 713/500 |

* cited by examiner

*Primary Examiner* — Thomas Lee
*Assistant Examiner* — Mohammad A Rahman
(74) *Attorney, Agent, or Firm* — Juan Carlos A. Marquez; Bacon & Thomas PLLC

(57) ABSTRACT

The present invention discloses a USB3.0 clock frequency generation device without crystal oscillator, that is, the crystal oscillator used in the USB3.0 device (or apparatus) is removed and replaced with an oscillator circuit module in the present invention, in which a simple circuit module is added to the controller circuit of the USB3.0 device to provide accurate and proper timing signals needed. The oscillator circuit module includes an oscillator block, a frequency divider block, a delta-sigma modulator block, and a preset number block.

6 Claims, 3 Drawing Sheets

USB3.0 CLOCK FREQUENCY GENERATION DEVICE WITHOUT CRYSTAL OSCILLATOR

BACKGROUND OF THE INVENTION

1. Technical Field

The present invention relates to USB3.0 clock frequency generation devices. More particularly, the present invention relates to a USB3.0 clock frequency generation device without crystal oscillator.

2. Description of Related Art

To ensure the proper linking and operation of all USB3.0 devices, most of the USB3.0 devices have a crystal oscillator to provide the timing signals for controller operation and data transmissions.

However, the prices of the crystal oscillator used in USB3.0 devices are usually expensive, and the size of the crystal oscillator together with the accompanying passive components always takes almost half of one side of the multi-layer PCBs (printed circuit boards) used in USB storage devices, such as USB pen drives (including USB2.0 and USB3.0 flash pen drives), not to say the complexity and bulk size of the circuitry needed to connect the crystal oscillator and the accompanying passive components with the driver chip and the flash chips.

SUMMARY OF THE INVENTION

The present invention discloses a USB3.0 clock frequency generation device without crystal oscillator, that is, the crystal oscillator used in the USB3.0 device (or apparatus) is removed and replaced with an oscillator circuit module in the present invention, in which a simple circuit module is added to the controller circuit of the USB3.0 device to provide accurate and proper timing signals needed. The oscillator circuit module includes an oscillator block, a frequency divider block, a delta-sigma modulator block, and a preset number block.

To achieve these and other effects, the USB3.0 clock frequency generation device without crystal oscillator of the present invention comprises: an oscillator block, which is to generate and output a primary frequency signal; a preset number block, which is to generate and output a preset number; a delta-sigma modulator block, which is to input an error number and the preset number, and to output a divider number; and a frequency divider block, which is to input the divider number and the primary frequency signal, and to output a secondary frequency signal.

By implementing the present invention, at least the following progressive effects can be achieved:

1. No crystal oscillator is required in USB3.0 devices.
2. Saving component costs and circuitry complexity.
3. Saving PCB size to make smaller application devices possible.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

Figure 1:
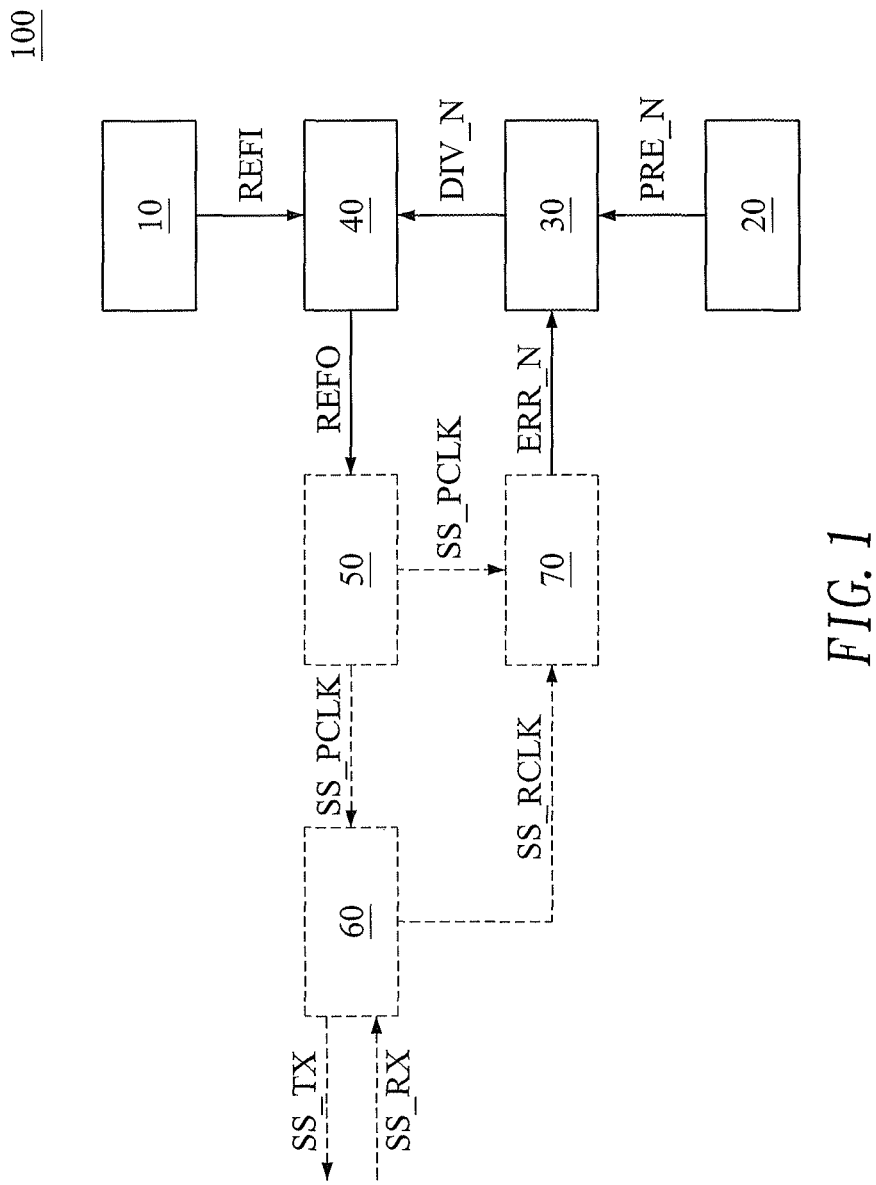
FIG. 1 is the USB3.0 clock frequency generation device block diagram of an embodiment of the present invention.

Please refer to FIG. 1 for an USB3.0 clock frequency generation device 100 of an embodiment of the present invention. The USB3.0 clock frequency generation device 100 comprises: a oscillator block 10, a preset number block 20, a delta-sigma modulator block 30, and a frequency divider block 40.

The oscillator block 10 shown in FIG. 1 is an oscillator circuit to generate and output a primary frequency signal REFI. The oscillator circuit can be one of the contemporary oscillator circuits such as ring oscillator (ROSC) circuit or inductor-capacitor oscillator (LC_OSC) circuit or any oscillator circuit that can generate stable timing signal in the frequency range required.

As shown in FIG. 1, the preset number block 20 is used to generate a preset number PRE_N and output the preset number PRE_N to the delta-sigma modulator block 30. Preset number block 20 can be a programmable number generator or a pure number generating hardware circuit.

The delta-sigma modulator block 30 shown in FIG. 1 is to input an error number ERR_N and the preset. number PRE_N, and to output a divider number DIV_N after performing Delta-Sigma calculation of the error number ERR_N and the preset number PRE_N.

As also shown in FIG. 1, the frequency divider block 40 is to input the divider number DIV_N from the delta-sigma modulator block 30 and the primary frequency signal REFI from the oscillator block 10, and to output a secondary frequency signal REFO after performing division of the primary frequency signal REFI by the divider number DIV_N.

Figure 2:
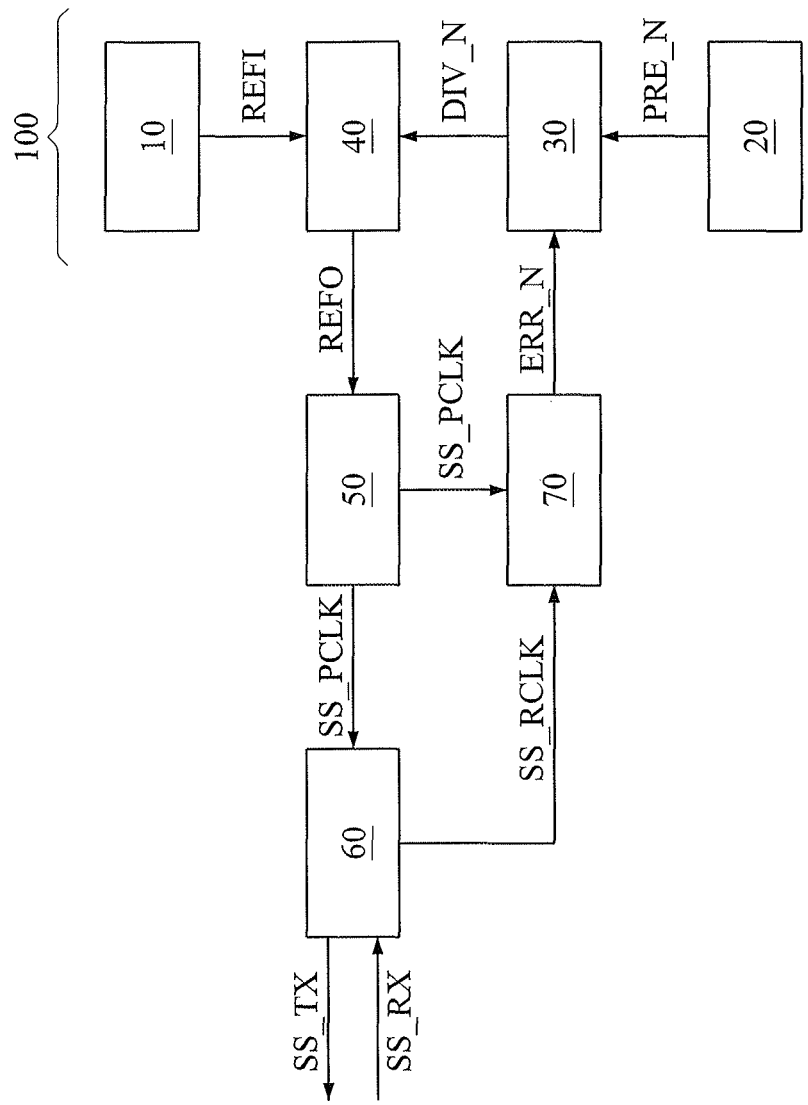
FIG. 2 is the block diagram of an embodiment of a USB3.0 apparatus having the USB3.0 clock frequency generation device of the present invention.

As shown in FIG. 2, is the block diagram of an embodiment of a USB3.0 apparatus having the USB3.0 clock frequency generation device 100 of the present invention. The USB3.0 apparatus comprises the USB3.0 clock frequency generation device 100, a USB3.0 super-speed PLL 50, a USB3.0 super-speed PHY 60 and a frequency counter 70.

As shown in FIG. 2, the USB3.0 super-speed PLL 50 is signal connected to the frequency divider block 40, the USB3.0 super-speed PHY 60 and the frequency counter 70. USB3.0 super-speed PLL 50 inputs secondary frequency signal REFO, and outputs a first clock signal SS_PCLK and a second clock signal SS_PCLK.

As shown in FIG. 2, USB3.0 super-speed PHY 60 is the physical unit of the USB3.0 apparatus that transmits and receives USB3.0 5 Gbps signals. USB3.0 super-speed PHY 60 inputs second clock signal SS_PCLK form USB3.0 super-speed PLL 50, receives a 5 Gbps receiver signal SS_RX, transmits 5 Gbps transmitter signal SS_TX and outputs a third clock signal SS_RCLK.

As also shown in FIG. 2, frequency counter 70, which is a hardware circuit, inputs first clock signal SS_PCLK from USB3.0 super-speed PLL 50, inputs third clock signal SS_RCLK from USB3.0 super-speed PHY 60, and outputs the error number ERR_N to delta-sigma modulator block 30 after counting the difference between the third clock signal SS_RCLK and the first clock signal SS_PCLK.

Figure 3:
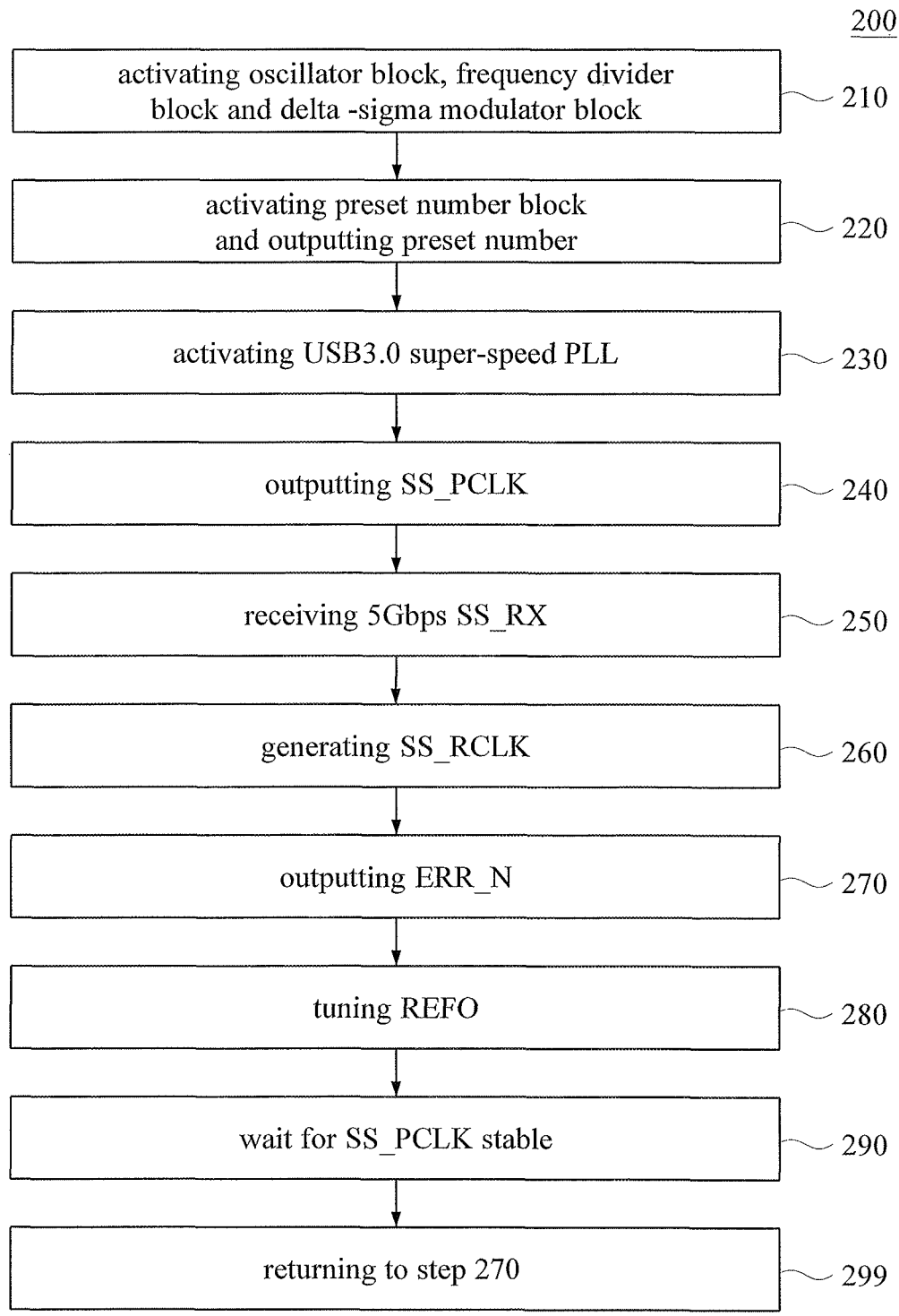
FIG. 3 is the USB3.0 clock frequency generation process steps of an embodiment of the present invention.

Please refer to FIG. 3 for the USB3.0 clock frequency generation process steps 200 of an embodiment of the present invention, it comprises: activating oscillator block, frequency divider block and delta-sigma modulator block (step 210); activating preset number block and outputting preset number (step 220); activating USB3.0 super-speed PLL (step 230);

outputting SS_PCLK (step 240); receiving 5 Gbps SS_RX (step 250); generating SS_RCLK (step 260); outputting ERR_N (step 270); tuning REFO (step 280); wait for SS_P-CLK stable (step 290); and returning to step 270 (step 299).

Activating oscillator block, frequency divider block and delta-sigma modulator block (step 210), to achieve the proper operation of the circuit blocks in the block diagrams as shown in FIG. 1 and FIG. 2, the oscillator block 10, the frequency divider block 40 and the delta-sigma modulator block 30 are first activated as shown in the first process step of FIG. 3.

Then, activating preset number block and outputting preset number (step 220) is to activate the preset number block to set a preset number PRE_N, and output the preset number PRE_N to the delta-sigma modulator block 30.

As also shown in FIG. 3, the next process step is activating USB3.0 super-speed PLL (step 230) (PLL—Phase Locked Loop), activating USB3.0 super-speed PLL (step 230) is to activate the USB3.0 super-speed PLL 50 to output a stable second clock signal SS_PCLK to trigger the USB3 super-speed PHY 60 to transform the 5 Gbps (Giga bit per second) signal SS_RX and generate a stable frequency signal SS_RCLK.

The next process step is then for the fine tuning of the timing signal. As shown in FIG. 3, outputting SS_PCLK (step 240), the clock signals SS_RCLK and SS_PCLK are fed into frequency counter 70, and frequency counter 70 outputs an error number ERR_N from comparing the third clock signal SS_RCLK and the first clock signal SS_PCLK. Wherein the frequency signal SS_PCLK is an output frequency signal output from the USB3 super-speed PLL 50, and the frequency signal SS_RCLK is the aforementioned frequency signal output from the USB3 super-speed PHY 60.

As shown in FIG. 3, receiving 5 Gbps SS_RX (step 250) and generating SS_RCLK (step 260) are the next steps to come. These two steps are for the USB3 super-speed PHY 60 to transform the 5 Gbps (Giga bit per second) signal SS_RX and generate a stable frequency signal SS_RCLK, and output the frequency signal SS_RCLK.

Then, outputting ERR_N (step 270) as shown in FIG. 3 is for the frequency counter 70 to count SS_RCLK and SS_P-CLK to generate the error number ERR_N and output ERR_N to delta-sigma modulator block 30.

As shown in FIG. 3, tuning REFO (step 280) is for delta-sigma modulator block 30 and frequency divider block 40 to tune REFO. Delta-sigma modulator block 30 reads the error number ERR_N output from frequency counter 70 and the preset number PRE_N output from the preset number block 20, then the delta-sigma modulator block 30 outputs DIV_N according to a calculation based on the input numbers ERR_N and PRE_N. Then frequency divider block 40 divides an output frequency REFI generated from the oscillator block by the number DIV_N, and output a secondary frequency signal REFO to the USB3.0 super-speed PLL 50.

As shown in FIG. 3, then the process comes to wait for SS_PCLK stable (step 290). The USB3.0 super-speed PLL 50 then multiplies the secondary frequency signal REFO with a preset constant number inside USB3.0 super-speed PLL 50, then again the USB3.0 super-speed PLL 50 outputs a stable second clock signal SS_PCLK to trigger the USB3.0 super-speed PHY 60 and a SS_PCLK signal to be compared with the signal SS_RCLK in the frequency counter 70.

As shown in FIG. 3, returning to step 270 (step 299) is introduced to have the recursion of the steps 270-290 as described above to make the frequency signal SS_PCLK eventually the same as the frequency signal SS_RCLK to meet the data transmission timing requirement defined by the USB3.0 protocol.

One illustrating example will be shown below for more explaining the procedure steps a-d described above. The example is:

Set the frequency of the primary frequency signal REFI to 318.15 MHz, and the number PRE_N to 10 and ½, and set a multiplying coefficient 8 and ⅓ in the USB3.0 super-speed PLL 50 to multiply with the secondary frequency signal REFO to generate the frequency signal SS_PCLK. This makes the secondary frequency signal REFO to be 30.3 MHz due to no input number ERR_N at this moment and the number DIV_N output from the delta-sigma modulator block 30 is the same with the number PRE_N, and the USB3.0 super-speed PLL 50 outputs a 250.25 MHz frequency signal SS_PCLK.

The data rate of SS_RX is 5 Gbps as defined in the USB3.0 protocol, and the frequency signal SS_RCLK output from the USB3 super-speed PHY block is 250 MHz by the predetermined circuit. The frequency counter 70 then compares the frequency signal SS_RCLK with the frequency signal SS_PCLK, and the number ERR_N output from the frequency counter 70 is 21/200.

The delta-sigma modulator block 30 then processes the numbers PRE_N and ERR_N and the output number DIV_N generated from the delta-sigma modulator block 30 is then 10 and 121/200.

The secondary frequency signal REFO is then changed to 30 MHz by dividing REFI signal (318.15 MHz) with the number DIV_N (10 and 121/200) in the frequency divider block 40.

Lastly, the frequency signal SS_PCLK output from the USB3.0 super-speed PLL 50 is changed to 250 MHz, which is the same as the frequency signal SS_RCLK, frequency is matched and a correct timing signal is generated.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A USB3.0 clock frequency generation device without crystal oscillator, the USB3.0 clock frequency generation device comprising:
   an oscillator block, which is to generate and output a primary frequency signal;
   a preset number block, which is to generate and output a preset number;
   a delta-sigma modulator block, which is to input an error number and the preset number, and to output a divider number after performing Delta-Sigma calculation of the error number and the preset number;
   a frequency divider block, which is to input the divider number and the primary frequency signal, and to output a secondary frequency signal;
   a USB3.0 super-speed PLL, connected to the frequency divider block to input the secondary frequency signal and then to output a first clock signal and a second clock signal;
   a USB3.0 super-speed PHY, connected to the USB3.0 super-speed PLL to input the second clock signal and to output a third clock signal; and
   a frequency counter, connected to the USB3.0 super-speed PLL, the USB3.0 super-speed PHY, and the delta-sigma modulator block to input the first clock signal and the third clock signal and to output the error number after counting the difference between the third clock signal and the first clock signal.

2. The USB3.0 clock frequency generation device of claim 1, wherein the USB3.0 super-speed PLL is a hardware circuit that inputs the secondary frequency signal and outputs the first clock signal and the second clock signal.

3. The USB3.0 clock frequency generation device of claim 1, wherein the USB3.0 super-speed PHY is a hardware circuit that inputs a 5Gbps receiver signal, and outputs a 5Gbps transmitter signal and the third clock signal.

4. The USB3.0 clock frequency generation device of claim 1, wherein the frequency counter is a hardware circuit that inputs the first clock signal and the third clock signal, and outputs the error number.

5. The USB3.0 clock frequency generation device of claim 1, wherein the oscillator block is a ring oscillator circuit (ROSC).

6. The USB3.0 clock frequency generation device of claim 1, wherein the oscillator block is an inductor-capacitor oscillator circuit (LC_OSC).

* * * * *